(12) United States Patent
Seyed-Bolorforosh

(10) Patent No.: US 6,277,299 B1
(45) Date of Patent: Aug. 21, 2001

(54) HIGH-SENSITIVITY PIEZOCOMPOSITE MATERIAL AND ULTRASONIC TRANSDUCER MADE THEREFROM

(75) Inventor: Mir Said Seyed-Bolorforosh, Portola Valley, CA (US)

(73) Assignee: General Electric Company, Milwaukee, WI (US)

(*) Notice: Subject to any disclaimer, the term of this patent is extended or adjusted under 35 U.S.C. 154(b) by 0 days.

(21) Appl. No.: 09/200,361

(22) Filed: Nov. 25, 1998

(51) Int. Cl.$^7$ ..................................................... H01L 41/22
(52) U.S. Cl. ............................. 252/62.9 R; 252/62.9 PZ; 310/320; 310/334; 310/335; 310/336; 310/337
(58) Field of Search ..................... 252/62.9 R, 62.9 PZ; 310/320, 334, 335, 336, 337

(56) References Cited

U.S. PATENT DOCUMENTS 4,613,784 * 9/1986 Haun et al. .................... 252/62.9 PZ
4,841,494 * 6/1989 Banno .................................... 310/337

FOREIGN PATENT DOCUMENTS

355694 * 2/1990 (EP) .

* cited by examiner

Primary Examiner—C. Melissa Koslow
(74) Attorney, Agent, or Firm—Christian G. Cabou; Dennis M. Flaherty

(57) ABSTRACT

A piezoelectrically active conformal filler material is incorporated in a 1-3, 3-3 or 2-2 piezocomposite structure. The piezoelectrically active conformal filler material has a 0-3 structure and is made of fine piezoelectric ceramic particles surrounded by a conformal polymer matrix. Using such piezocomposite material, the reception and transmission sensitivity (efficiency) of a piezoelectric layer can be improved without any increase in the acoustic impedance of the final piezoelectric layer. The resulting piezocomposite material can be used to fabricate ultrasonic transducer arrays.

17 Claims, 3 Drawing Sheets

HIGH-SENSITIVITY PIEZOCOMPOSITE MATERIAL AND ULTRASONIC TRANSDUCER MADE THEREFROM

FIELD OF THE INVENTION

This invention generally relates to ceramic-polymer composites. In particular, the invention relates to composites made of piezoelectric ceramic and polymer materials suitable for use in ultrasonic transducers.

BACKGROUND OF THE INVENTION

Conventional ultrasonic transducers for medical applications are constructed from one or more piezoelectric elements sandwiched between a pair of backing/matching layers. Such piezoelectric elements are constructed in the shape of plates or rectangular beams bonded to the backing and matching layers. The piezoelectric material is typically lead zirconate titanate (PZT), polyvinylidene difluoride (PVDF), or PZT ceramic/polymer composite.

Piezoelectric ceramics are formed by conventional processes, such as dry pressing, casting or extrusion, and then sintered. After sintering, the ceramic elements are machined to the desired dimensions and then plated to form electrodes. The final step is to subject the ceramic elements to a process known as "poling". In this process, the constituents of the ceramic material are physically reorganized by heating the material to a temperature in excess of the Curie temperature while maintaining an electric field across the material. The electric field organizes some atoms into electric domains that produce the piezoelectric effect. This reorganization is retained when the material is quenched.

One type of ultrasonic transducer element is made of composite material comprising piezoelectric ceramic material surrounded by a piezoelectrically passive polymer matrix. The combination of a piezoelectric ceramic with a polymer provides a flexible or shapable material with good piezoelectric properties.

When combining materials, in addition to selecting component phases which have the desired properties, one must couple the component phases to each other in an optimal manner. Connectivity of the individual phases is a critical parameter in composites designed for use as piezoelectric transducers because connectivity controls the electric flux pattern as well as the mechanical properties. Each phase in a composite may be self-connected in zero, one, two or three dimensions. For diphasic composites, there are ten connectivities: 0-0, 0-1, 0-2, 0-3, 1-1, 1-2, 1-3, 2-2, 2-3 and 3-3, where the first number in each pair indicates the number of dimensions of connectivity for the first component phase of a diphasic composite and the second number in each pair indicates the number of dimensions of connectivity for the second component phase of that diphasic composite.

The piezocomposite structures most commonly used in ultrasonic transducers are the 1-3 and 2-2 structures. For example, an exemplary 1-3 structure comprises a multiplicity of mutually parallel, spaced PZT rods embedded in a matrix of conformal polymer filler material. In contrast, the 2-2 structure comprises alternating layers of piezoelectric ceramic and polymer. The conformal polymer filler materials used in the design of piezocomposite resonators have historically been piezoelectrically passive.

There is a need for a piezocomposite material having improved piezoelectricity constant, dielectric constant and electromechanical coupling factor as compared to conventional piezocomposite materials used in ultrasonic transducers.

SUMMARY OF THE INVENTION

The present invention is a piezocomposite material which incorporates piezoelectrically active conformal filler material. Using such piezocomposite material, the reception and transmission sensitivity (efficiency) of a piezoelectric layer can be improved without any increase in the acoustic impedance of the final piezoelectric layer. Three desirable characteristics for any piezoelectric material used in the design of clinical and industrial ultrasonic transducers are: (1) high piezoelectricity constant ($D_{33}$); (2) high dielectric constant ($\epsilon_{33}$); and (3) high electromechanical coupling constant ($K_{33}$). The present invention results in higher piezoelectricity constant, higher dielectric constant and higher electromechanical coupling constant as compared to the conventional piezocomposite materials.

In accordance with some preferred embodiments of the invention, piezoelectrically active conformal filler material is incorporated in a 1-3, 3-3 or 2-2 piezocomposite structure. The piezoelectrically active conformal filler material has a 0-3 structure. Preferably, the piezoelectrically active conformal filler material comprises fine piezoelectric ceramic particles surrounded by a conformal polymer matrix.

In accordance with a further aspect of the invention, the piezoelectric characteristics of the filler material can be varied along three major axes, which allows for the design of novel transducer structures.

In accordance with another preferred embodiment, the piezoelectric ceramic powder used in the 0-3 composite filler material is made of a material which is piezoelectrically active in the presence of an externally applied static electric field and becomes piezoelectrically passive when the electric field is removed.

DETAILED DESCRIPTION OF THE PREFERRED EMBODIMENTS

Figure 1:
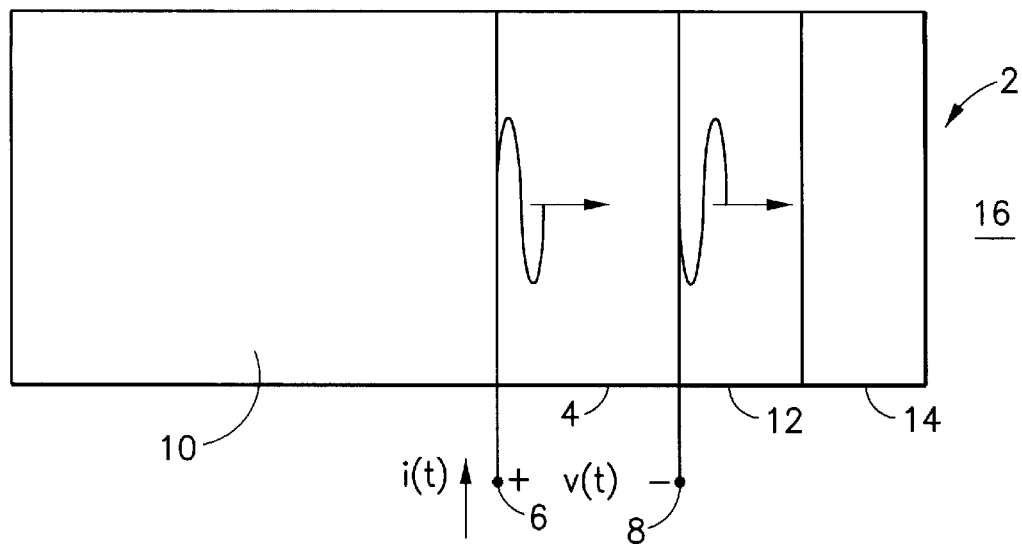
FIG. 1 is a diagram showing the basic structure of a conventional ultrasonic transducer.

Almost all conventional transducers use some variation of the geometry shown in FIG. 1. The basic ultrasonic transducer 2 consists of layers of materials, at least one of which is a piezoelectric plate 4 coupled to a pair of electric terminals 6 and 8. The electric terminals are connected to an electrical source having an impedance $Z_S$. When a voltage waveform v(t) is developed across the terminals, the material of the piezoelectric element compresses at a frequency corresponding to that of the applied voltage, thereby emitting an ultrasonic wave into the media to which the piezoelectric element is coupled. Conversely, when an ultrasonic wave impinges on the material of the piezoelectric element, the latter produces a corresponding voltage across its terminals and the associated electrical load component of the electrical source.

Typically, the front surface of piezoelectric element 4 is covered with one or more acoustic matching layers or windows (e.g., 12 and 14) that improve the coupling with the media 16 in which the emitted ultrasonic waves will propagate. In addition, a backing layer 10 is coupled to the rear surface of piezoelectric element 4 to absorb ultrasonic waves that emerge from the back side of the element so that they will not be partially reflected and interfere with the ultrasonic waves propagating in the forward direction. A number of such ultrasonic transducer constructions are disclosed in U.S. Pat. Nos. 4,217,684, 4,425,525, 4,441,503, 4,470,305 and 4,569,231, all of which are commonly assigned to the instant assignee.

Figure 2:
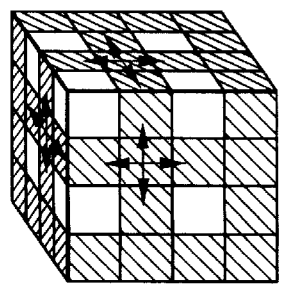

In accordance with the preferred embodiments of the present invention, the piezoelectric elements of a transducer array are made of a piezocomposite material which incorporates piezoelectrically active conformal filler material. The piezoelectrically active conformal filler material has a 0-3 structure of the type shown in FIG. 2 (using a cube as the basic building block), i.e., zero dimensions of connectivity for the piezoelectric ceramic material incorporated in the filler material and three dimensions of connectivity for the polymer incorporated in the filler material. Preferably, the piezoelectrically active conformal filler material comprises fine piezoelectric ceramic particles surrounded by a conformal polymer matrix. In accordance with the preferred embodiments of the invention, the piezoelectrically active filler material and the piezoelectric ceramic material are formed as a structure having a connectivity pattern which is not a 0-3 connectivity pattern.

Figure 3:
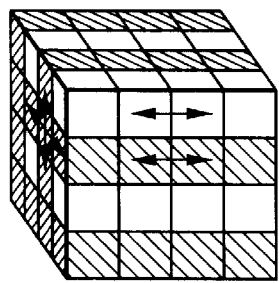

In a first preferred embodiment, piezoelectrically active conformal filler material (hatched blocks) and piezoelectric ceramic material (unhatched) are formed as a structure having 1-3 connectivity, as seen in FIG. 3. For example, the piezoelectric ceramic material may be formed as a multiplicity of mutually parallel, spaced rods in a matrix formed by the piezoelectrically active conformal filler material.

Figure 4:
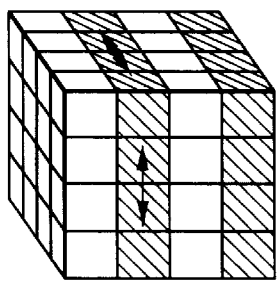
FIGS. 2–4 are schematics showing the connectivity patterns for the following diphasic solids: 0-3 composite (FIG. 2); 1-3 composite (FIG. 3); and 2-2 composite (FIG. 4). The hatched blocks denote filler material; the unhatched blocks denote piezoelectric ceramic material.

In a second preferred embodiment, piezoelectrically active conformal filler material and piezoelectric ceramic material are formed as a 2-2 structure, i.e., alternating layers, as seen in FIG. 4. An element made of piezocomposite material having the 2-2 structure shown in FIG. 4 is oriented in the transducer array such that the X axis is aligned in the azimuthal direction, the Z axis is aligned in the elevational direction and the Y axis is aligned in the direction of ultrasound wave propagation.

Figure 6:
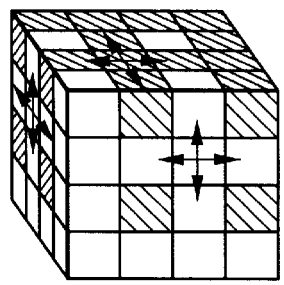
FIGS. 5 and 6 are schematics showing two views of the connectivity pattern for a 3-3 composite. The two views are related by 90° counterclockwise rotation about the Z axis. Again the hatched blocks denote filler material, whereas the unhatched blocks denote piezoelectric ceramic material.
Figure 5:
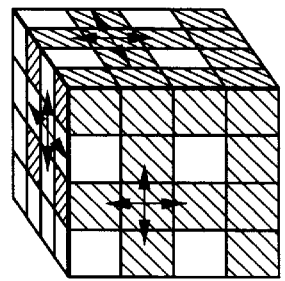

In a third preferred embodiment, piezoelectrically active conformal filler material and piezoelectric ceramic material are formed as a 3-3 structure, as seen in FIGS. 5 and 6. In the 3-3 connectivity pattern, the two phases form interpenetrating three-dimensional networks. Two views of the 3-3 connectivity pattern are given because the interpenetrating networks are difficult to visualize. The views of FIGS. 5 and 6 are related by 90° counterclockwise rotation about the Z axis. This structure can be fabricated using the lost-wax method.

Figure 7:
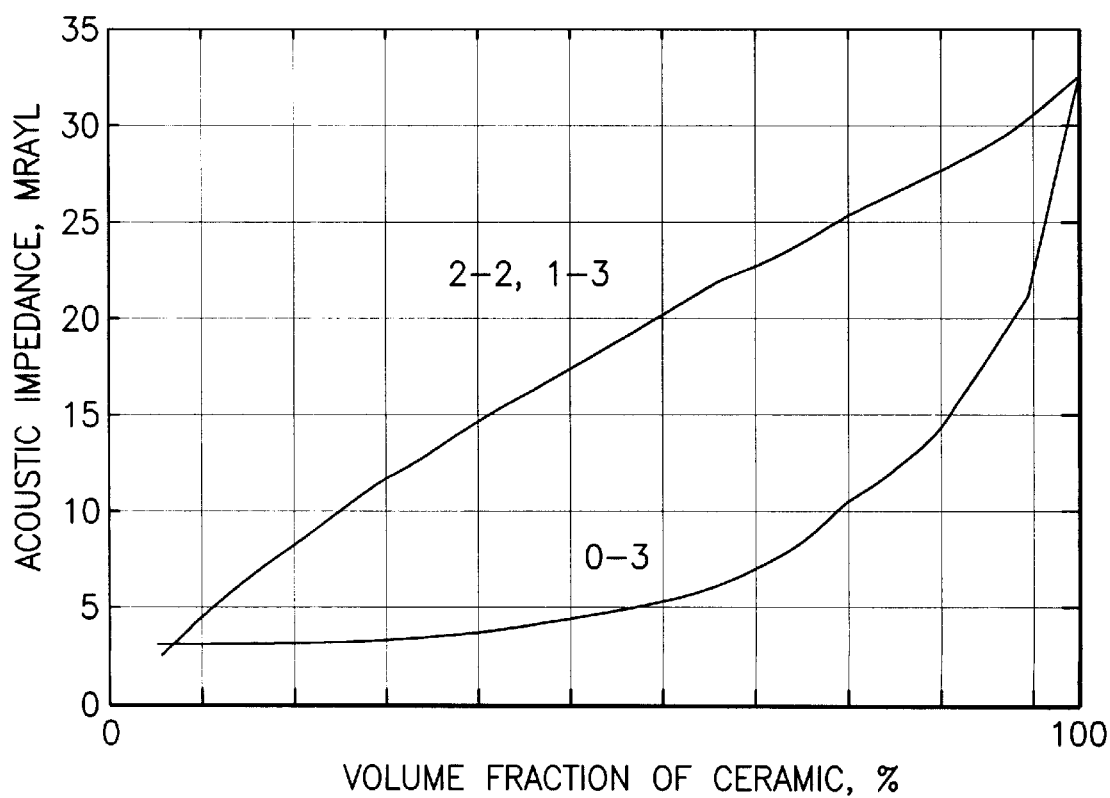
FIG. 7 is a graph showing variation in acoustic impedance as a function of the ceramic volume fraction for 0-3, 1-3 and 2-2 piezocomposite materials.

The acoustic impedances of 1-3, 2-2 and 0-3 piezocomposite materials as a function of the volume fraction of the piezoelectric ceramic material are shown in FIG. 7. The acoustic impedance of 1-3 and 2-2 piezocomposite materials increases linearly over a certain range with an increase in volume fraction of the piezoelectric ceramic material. However, in the case of 0-3 piezocomposite material, the acoustic impedance increases slowly with increase in the volume fraction of piezoelectric ceramic material. The invention utilizes this unique property of the 0-3 piezocomposite material. Typical conformal filler materials used in the design of piezocomposite materials have an acoustic impedance ranging from 2.7 to 5 MRayl. A 0-3 piezocomposite material with a ceramic volume fraction of 50% would have an acoustic impedance close to 5 Mrayl.

Figure 8:
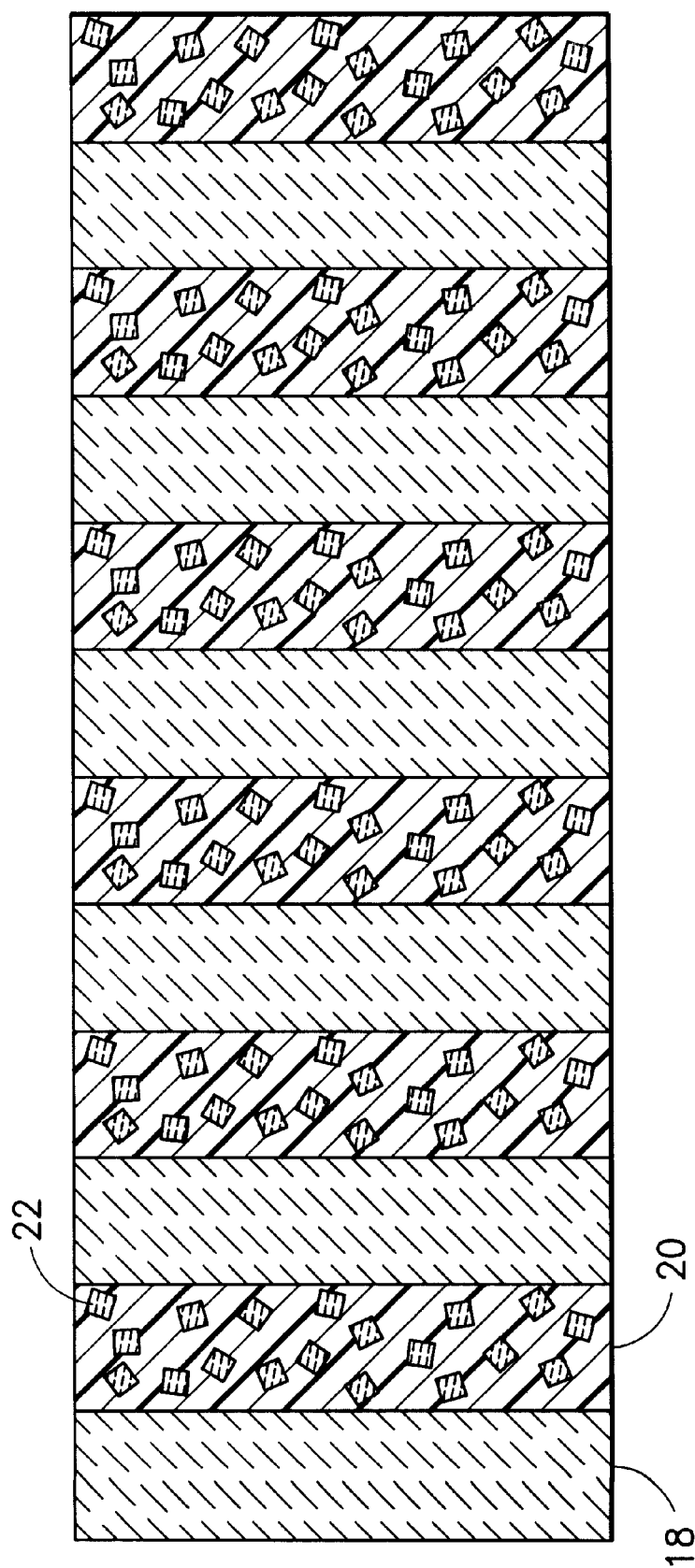
FIG. 8 is a schematic showing a cross-sectional view of the piezoelectric ceramic composite material in accordance with preferred embodiments of the invention.

In accordance with the first and second preferred embodiments, 0-3 piezocomposite material is used as the piezoelectrically active filler material for the 1-3 and 2-2 piezocomposite materials respectively. The structure of such 1-3 and 2-2 piezocomposite materials is shown in more detail in FIG. 8, in which numeral 18 designates the columns (1-3) or layers (2-2) of piezoelectric ceramic material, numeral 20 designates the matrix (1-3) or layers (2-2) of polymeric material and numeral 22 designates particles of piezoelectric ceramic material suspended in the matrix (1-3) or layers (2-2) of polymeric material. The preferred polymer has a medium or high mechanical stiffness. The preferred piezoelectric ceramic particles are in the form of a fine (5–20 $\mu$m in diameter) PZT-5H powder.

The filler material of the invention is poled to render it piezoelectrically active. The piezoelectrically active filler material of the invention generates a mechanical strain in the presence of an applied electric field. Also, once a mechanical stress is applied to the piezoelectric material, a corresponding electric charge is generated from the conformal filler material. This results in a higher sensitivity of the piezocomposite material.

The concept of the invention can be extended. For example, the piezoelectric ceramic powder used in the design of the 0-3 composite filler material can be made of relaxor ferroelectric ceramic materials (e.g., lead metaniobate (PMN):lead titanate (PT)) with a Curie temperature close to room temperature. These materials are piezoelectrically active in the presence of an externally applied static or quasi-static electric field. This would allow control of the transducer sensitivity using an externally applied static electric field. Hence the piezoelectric activity in the active filler material can be externally controlled. This can be used to control the elevation aperture apodization function in a multi-row transducer array by varying the transducer sensitivity locally in the elevation direction, i.e., by electrically controlling the respective sensitivities of the transducer elements in a column to achieve apodization. Alternatively, the transducer element sensitivity for the transmit can be controlled by adjusting the applied static DC bias. In addition, the transducer element sensitivity can be controlled to provide time-gain compensation on receive.

The foregoing preferred embodiments have been disclosed for the purpose of illustration. Variations and modifications of the basic concept of the invention will be readily apparent to those skilled in the art. All such variations and modifications are intended to be encompassed by the claims set forth hereinafter.

The term "piezoelectric", as used in the claims, means a material which has been poled and does not become piezoelectrically passive when the poling electric field is removed. The term "piezoelectrically activatable", as used in the claims, means a material which must be activated to become piezoelectrically active and which becomes piezoelectrically passive upon removal of the activating influence, e.g., a ceramic material which becomes piezoelectrically active in the presence of a static electric field and which becomes piezoelectrically passive when the static electric field is removed.

What is claimed is:

1. A piezocomposite material comprising first, second and third component phases, wherein said first and second component phases have a first connectivity pattern selected from the group consisting of 1-3, 2-2 and 3-3 connectivity patterns, and said second and third component phases have a 0-3 connectivity pattern, and wherein said first and third component phases are made of piezoelectric material, said second component phase is made of material which is not piezoelectric.

2. A piezocomposite material comprising first, second and third solid component phases, wherein said first and second component phases have a first connectivity pattern selected from a group consisting of 1-3, 2-2 and 3-3 connectivity patterns, and said second and third component phases have a 0-3 connectivity pattern, and wherein said first and third component phases are made of piezoelectric ceramic material and said second component phase is made of polymeric material.

3. The piezocomposite material as recited in claim 2, wherein said piezoelectric ceramic material of said third component phase is in the form of particles embedded in said polymeric material.

4. The piezocomposite material as recited in claim 3, wherein the volume fraction of ceramic particles in said polymeric material is varied along a spatial axis.

5. The piezocomposite material as recited in claim 2, wherein said third component phase is in the form of particles of a piezoelectrically activatable ceramic material embedded in said polymeric material, said piezoelectrically activatable ceramic material being piezoelectrically active in the presence of a static electric field and being piezoelectrically passive in the absence of a static electric field.

6. The piezocomposite material as recited in claim 5, wherein said piezoelectrically activatable ceramic material is lead metaniobate:lead titanate.

7. An ultrasonic transducer comprising a block of piezocomposite material, said piezocomposite material in turn comprising first, second and third solid component phases, said first and second component phases having a connectivity pattern selected from the group consisting of 1-3, 2-2 and 3-3 connectivity patterns, and said second and third component phases having a 0-3 connectivity pattern, and wherein said first and third component phases are made of piezoelectric material, said second component phase is made of material which is not piezoelectric.

8. An ultrasonic transducer comprising a block of piezocomposite material, said piezocomposite material in turn comprising first, second and third solid component phases, said first and second component phases having a connectivity pattern selected from the group consisting of 1-3, 2-2 and 3-3 connectivity patterns, and said second and third component phases having a 0-3 connectivity pattern, and wherein said first and third component phases are made of piezoelectric ceramic material and said second component phase is made of polymeric material.

9. The ultrasonic transducer as recited in claim 8, wherein said piezoelectric ceramic material of said third component phase is in the form of particles embedded in said polymeric material.

10. The ultrasonic transducer as recited in claim 9, wherein the volume fraction of ceramic particles in said polymeric material is varied along a spatial axis.

11. The ultrasonic transducer as recited in claim 8, wherein said third component phase is in the form of particles of a piezoelectrically activatable ceramic material embedded in said polymeric material, said piezoelectrically activatable ceramic material being piezoelectrically active in the presence of a static electric field and being piezoelectrically passive in the absence of a static electric field.

12. The ultrasonic transducer as recited in claim 11, wherein said piezoelectrically activatable ceramic material is lead metaniobate:lead titanate.

13. An ultrasonic transducer array comprising a multiplicity of transducer elements, each of said elements comprising a layer of piezocomposite material sandwiched between a layer of backing material and a layer of matching material, said piezocomposite layer having a back surface to which said backing layer is bonded and a front surface to which said matching layer is bonded, and means for applying a varying voltage across said piezocomposite layer, wherein said piezocomposite material comprises first, second and third solid component phases, said first and second component phases having a connectivity pattern selected from the group consisting of 1-3, 2-2 and 3-3 connectivity patterns, and said second and third component phases having a 0-3 connectivity pattern, and wherein said first and third component phases are made of piezoelectric material, said second component phase is made of material which is not piezoelectric.

14. A piezocomposite material comprising first, second and third solid component phases, wherein said second and third component phases have a 0-3 connectivity pattern and said first and second component phases have a 2-2 connectivity pattern.

15. A piezocomposite material comprising first, second and third solid component phases, wherein said second and third component phases have a 0-3 connectivity pattern and said first and second component phases have a 3-3 connectivity pattern.

16. An ultrasonic transducer comprising a block of piezocomposite material, said piezocomposite material in turn comprising first, second and third solid component phases, wherein said second and third component phases have a 0-3 connectivity pattern and said first and second component phases have a 2-2 connectivity pattern.

17. An ultrasonic transducer comprising a block of piezocomposite material, said piezocomposite material in turn comprising first, second and third solid component phases, wherein said second and third component phases have a 0-3 connectivity pattern and said first and second component phases have a 3-3 connectivity pattern.

* * * * *